Ed Patent No.: US 7,746,120 B2
Date of Patent: Jun. 29, 2010

(12) United States Patent
Umeda et al.

(54) VOLTAGE TO CURRENT CONVERTER

(75) Inventors: Toshiyuki Umeda, Inagi (JP); Shoji Otaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/359,646

(22) Filed: Jan. 26, 2009

(65) Prior Publication Data

US 2009/0295434 A1 Dec. 3, 2009

(30) Foreign Application Priority Data

Jun. 2, 2008 (JP) .............................. 2008-145054

(51) Int. Cl.
*H02M 11/00* (2006.01)

(52) U.S. Cl. ...................... 327/103; 330/288

(58) Field of Classification Search ................. 323/315; 327/103, 524; 330/288
See application file for complete search history.

(56) References Cited

U.S. PATENT DOCUMENTS 5,754,066 A * 5/1998 Smith ......................... 327/108
6,046,578 A * 4/2000 Feldtkeller ................... 323/314
7,424,265 B2 9/2008 Umeda et al.
2007/0273411 A1* 11/2007 Harris et al. ................. 327/103
2008/0100491 A1 5/2008 Umeda et al.

FOREIGN PATENT DOCUMENTS

JP 2007-129501 5/2007

* cited by examiner

*Primary Examiner*—Lincoln Donovan
*Assistant Examiner*—William Hernandez
(74) *Attorney, Agent, or Firm*—Oblon, Spivak, McClelland, Maier & Neustadt, L.L.P.

(57) ABSTRACT

A signal receiving device includes: a first conversion unit comprising a first input terminal to which a signal including a voltage signal and a reference voltage is inputted, and a first output terminal which output a first current signal voltage-current converted from the signal; a second conversion unit comprising a second input terminal to which the reference voltage is inputted, and a second output terminal which output a second current signal voltage-current converted from the reference voltage; a current mirror circuit comprising a third input terminal to which the second current signal is inputted, and a third output terminal which output a third current signal corresponding to the second current signal; and an output unit connected to both the first and third output terminals.

13 Claims, 5 Drawing Sheets

VOLTAGE TO CURRENT CONVERTER

CROSS-REFERENCE TO THE RELATED APPLICATIONS

This application is based upon and claims the benefit of priority from the prior Japanese Patent Application No. 2008-145054, filed on Jun. 2, 2008; the entire contents of which are incorporated herein by reference.

BACKGROUND OF THE INVENTION

1. Field of the Invention

The present invention relates to a signal receiving device capable of inputting a weak voltage signal.

2. Description of the Related Art

A signal amplifier amplifying an inputted signal is in use (for example, see JP-A2007-129501 (KOKAI)). In the signal amplifier described in Document, a voltage signal inputted to a signal input terminal is converted to a current by a transistor and outputted as a current signal via a current mirror. On this occasion, if a voltage of the inputted signal is lower than a threshold voltage of the transistor, the transistor becomes in an OFF state, so that the outputted current is zero. In other words, if an inputted signal is weak, it is difficult to output a current from the signal amplifier.

BRIEF SUMMARY OF THE INVENTION

A signal receiving device according to an aspect of the present invention includes: a first conversion unit comprising a first input terminal to which a signal including a voltage signal and a reference voltage is inputted, and a first output terminal which output a first current signal voltage-current converted from the signal; a second conversion unit comprising a second input terminal to which the reference voltage is inputted, and a second output terminal which output a second current signal voltage-current converted from the reference voltage; a current mirror circuit comprising a third input terminal to which the second current signal is inputted, and a third output terminal which output a third current signal corresponding to the second current signal; and an output unit connected to both the first and third output terminals.

DETAILED DESCRIPTION OF THE EMBODIMENTS

Hereinafter, embodiments of the present invention will be described in detail with reference to the drawings.

First Embodiment

Figure 1:
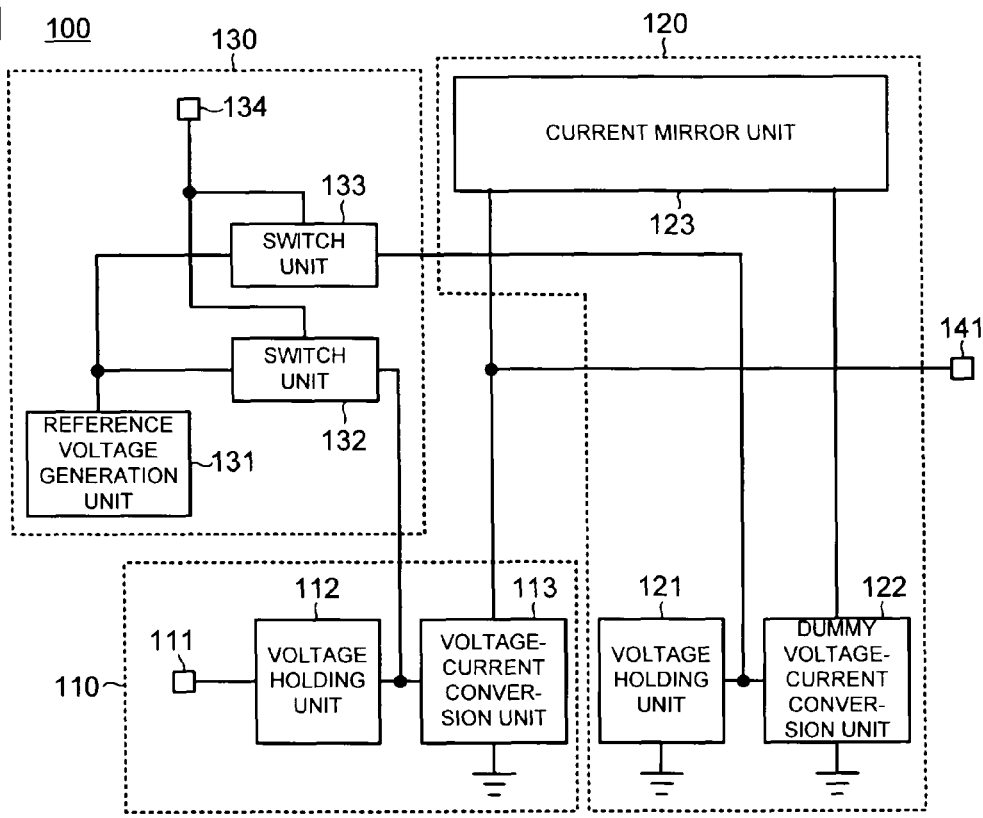
FIG. 1 is a block diagram showing a signal receiving device 100 according to a first embodiment.

FIG. 1 is a block diagram showing a signal receiving device 100 according to a first embodiment. The signal receiving device 100 includes a signal receiving unit 110, a leak current compensation unit 120, a bias voltage generation unit 130, and a signal output unit 141.

The signal receiving unit 110 is constituted with a signal input unit 111, a voltage holding unit 112, and a voltage-current conversion unit 113. The signal input unit 111, the voltage holding unit 112 and the voltage-current conversion unit 113 are connected in sequence. The voltage-current conversion unit 113 is grounded.

The leak current compensation unit 120 is constituted with a voltage holding unit 121, a dummy voltage-current conversion unit 122, and a current mirror unit 123. The voltage holding unit 121 is connected to the dummy voltage-current conversion unit 122. The dummy voltage-current conversion unit 122 is connected to the current mirror unit 123. The voltage holding unit 121 and the dummy voltage-current conversion unit 122 are each grounded. The current mirror unit 123 is connected to the voltage-current conversion unit 113, and a connection point thereof is connected to the signal output unit 141.

The bias voltage generation unit 130 is constituted with a reference voltage generation unit 131, switch units 132, 133, and a control signal input unit 134. The reference voltage generation unit 131 is connected to a connection point between the voltage-current conversion unit 113 and the voltage holding unit 112 via the switch unit 132. The reference voltage generation unit 131 is connected to a connection point between the dummy voltage-current conversion unit 122 and the voltage holding unit 121 via the switch unit 133. Control terminals of the switch units 132, 133 are connected to the control signal input unit 134.

The signal input unit 111 is an input terminal inputting a voltage signal, in particular, a weak voltage signal.

The voltage holding units 112, 121 are elements, for example, capacitors (capacitor elements), which hold inputted voltages.

The voltage-current conversion unit 113 and the dummy voltage-current conversion unit 122 are elements, for example, transistors, which convert inputted voltages into currents. It is preferable that the voltage-current conversion unit 113 and the dummy voltage-current conversion unit 122 are close in terms of threshold voltages and leak currents. Therefore, it is preferable that transistors of the same form are used for the voltage-current conversion unit 113 and the dummy voltage-current conversion unit 122. Further, diversity of the threshold voltage values due to manufacturing variance can be reduced by dividing both the voltage-current conversion unit 113 and the dummy voltage-current conversion unit 122 and disposing alternately and evenly. The threshold voltages are limits of voltages which the voltage-current conversion unit 113 and the dummy voltage-current conversion unit 122 can convert to currents. The leak current is a comparatively weak current outputted from the voltage-current conversion unit 113 (or the dummy voltage-current conversion unit 122) at a time of a voltage equal to or lower than the threshold voltage.

The current mirror unit 123 outputs to an output terminal a current almost equal to a current which is inputted to an input terminal.

The control signal input unit 134 is an input terminal inputting a control signal to control the switch units 132, 133. The switch units 132, 133 are turned ON/OFF in accordance with the control signal (ON signal, OFF signal) and apply reference voltages to the voltage holding units 112, 121. A pulse signal can be used as the control signal. It is preferable that a duty ratio (period Ton of ON state/(period Ton of ON state+ period T off of OFF state)) of the pulse signal is small to some degree. The smaller duty ratio of the pulse signal brings increased periods of time for which the voltage holding units 112, 121 hold the reference voltages. As a result, stability of an operation is maintained.

The reference voltage generation unit 131 generates a reference voltage. It is preferable that the reference voltage is equal to or lower than the threshold voltage of the voltage-current conversion unit 113, in the interest of power consumption. It is also preferable that the reference voltage is close to the threshold voltages of the voltage-current conversion unit 113 and the dummy voltage-current conversion unit 122. In this case, it can be considered to make the respective transistors constituting the voltage-current conversion unit 113, the dummy voltage-current conversion unit 122 and the reference voltage generation unit 131 have the same configuration. By using the transistor having the same configuration as that of the voltage-current conversion unit 113 for the reference voltage generation unit 131, it becomes easy to make the reference voltage and the threshold value of the voltage-current conversion unit 113 close to each other. Further, creating the transistors of the same configuration simultaneously enables compensation of manufacturing variance.

(Operation of Signal Receiving Device 100)

An operation of the signal receiving device 100 will be described. The reference voltage generated in the reference voltage generation unit 131 is supplied to an input terminal of the voltage-current conversion unit 113 via the switch unit 132. The same reference voltage is supplied to an input terminal of the dummy voltage-current conversion unit 122 via the switch unit 133. The voltages supplied to the respective input terminals are held by the voltage holding units 112, 121. The switch units 132, 133 are opened/closed intermittently by a control signal inputted to the control signal input unit 134 and inject the reference voltages to the voltage holding units 112, 121, to make the reference voltages held. The reference voltage generated in the reference voltage generation unit 131 is close to the threshold voltages of the voltage-current conversion units 113, 122.

In a no signal input state (no signal is inputted to the signal input unit 111), only the reference voltage (voltage close to the threshold voltage) generated in the reference voltage generation unit 131 is applied to the input terminal of the voltage-current conversion unit 113. On this occasion, a leak current is outputted from the voltage-current conversion unit 113.

On the other hand, the reference voltage generated in the reference voltage generation unit 131 is also applied to the input terminal of the dummy voltage-current conversion unit 122. On this occasion, a leak current (almost the same as the leak current outputted from the voltage-current conversion unit 113) is outputted from the dummy voltage-current conversion unit 122.

The leak current outputted from the dummy voltage-current conversion unit 122 is folded by the current mirror unit 123 and outputted from an output terminal of the current mirror unit 123. A difference between an output current of the current mirror unit 123 and an output current of the voltage-current conversion unit 113 is outputted from the signal output unit 141. As a result, no signal is outputted from the signal output unit 141 at a time of no signal input.

When a signal is inputted to the signal input unit 111, the input signal is inputted to the input terminal of the voltage-current conversion unit 113 via the voltage holding unit 112. As stated above, the reference voltage generated in the reference voltage generation unit 131 is applied to the input terminal of the voltage-current conversion unit 113. Therefore, if the signal is inputted, a signal voltage is added to the reference voltage. Therefore, a current made by adding the signal and a leak current are outputted from the voltage-current conversion unit 113. On the other hand, the leak current outputted from the dummy voltage-current conversion unit 122 is inputted to the input terminal of the current mirror unit 123, folded, and outputted from its output terminal. The difference between the output current of the current mirror unit 123 and the output current of the voltage-current conversion unit 113 is outputted from the signal output unit 141. Therefore, only a signal current component (made by removing a leak current component from the current outputted from the voltage-current conversion unit 113) is outputted from the output signal unit 141 at a signal input time.

As stated above, in the signal receiving device 100, even if an input signal is a weak voltage signal, a current can be outputted effectively and an error due to a leak current can be reduced.

Second Embodiment

Figure 2:
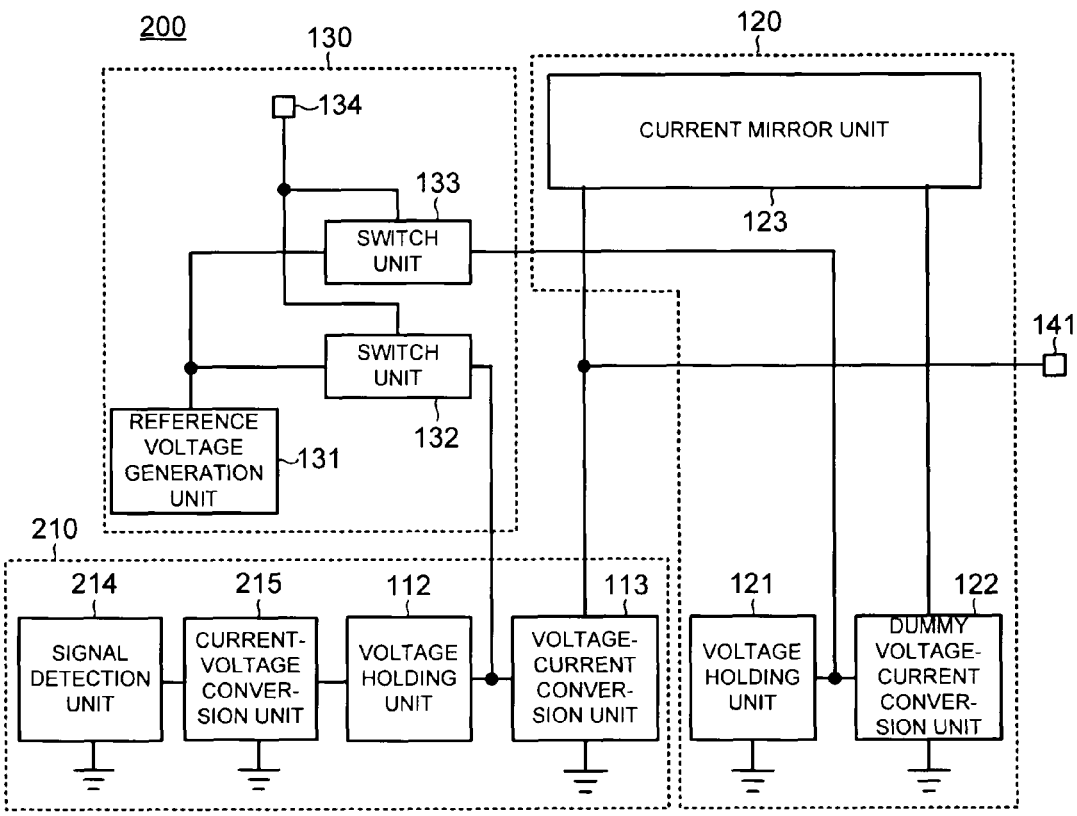
FIG. 2 is a block diagram showing a signal receiving device 200 according to a second embodiment.

FIG. 2 is a block diagram showing a signal receiving device 200 according to a second embodiment. The signal receiving device 200 includes a signal receiving unit 210, a leak voltage compensation unit 120, a bias voltage generation unit 130 and a signal output unit 141. The signal receiving unit 210 has a signal detection unit 214 and a current-voltage conversion unit 215 instead of the signal input unit 111 of the signal receiving device 100. An output terminal of the signal detection unit 214, one end of which is grounded, is connected to a voltage holding unit 112 via the current-voltage conversion unit 215. A signal detection unit of a current output type can be used as the signal detection unit 214. The current-voltage conversion unit 215 is grounded. A capacitor, for example, can be used as the current-voltage conversion unit 215.

A current signal generated in the signal detection unit 214 is converted to a voltage in the current-voltage conversion unit 215, and thereafter inputted to an input terminal of a voltage-current conversion unit 113 via a voltage holding unit 112. In the signal receiving device 200, even if an input signal is a weak voltage signal, a current can be outputted effectively and an error due to a leak current can be reduced.

Third Embodiment

Figure 3:
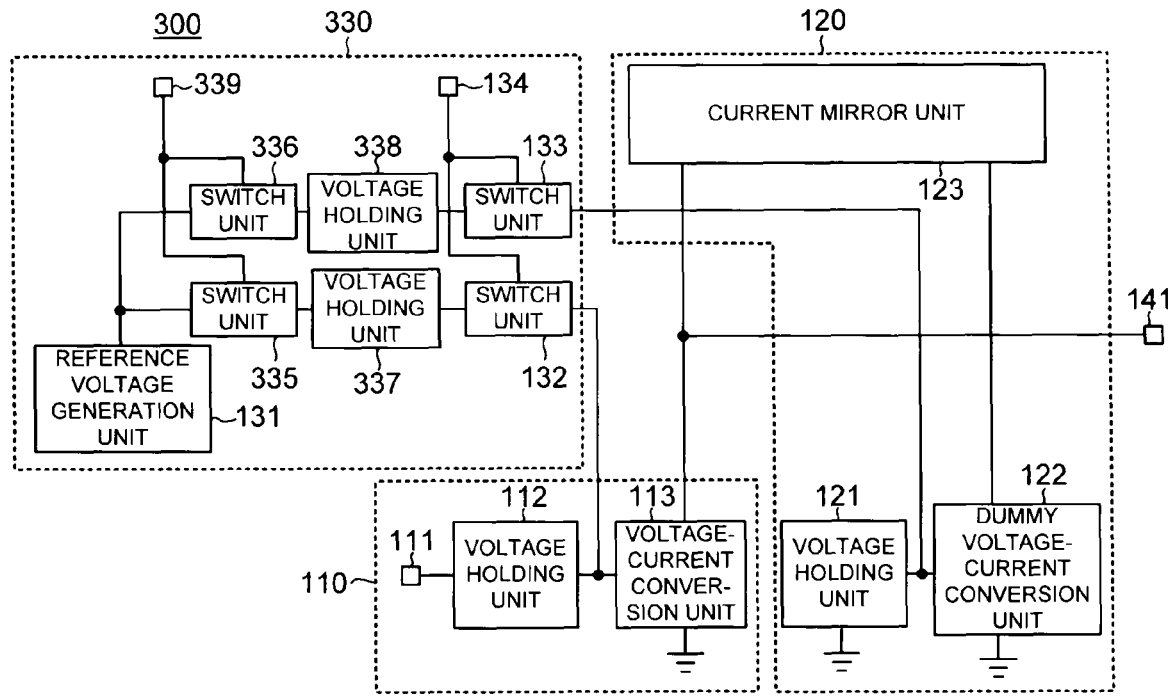
FIG. 3 is a block diagram showing a signal receiving device 300 according to a third embodiment.

FIG. 3 is a block diagram showing a signal receiving device 300 according to a third embodiment. The signal receiving device 300 includes a signal receiving unit 110, a leak current compensation unit 120, a bias voltage generation unit 330 and a signal output unit 141. In the bias voltage generation unit 330, added to the bias voltage generation unit 130 in the first embodiment are switch units 335, 336, voltage holding units 337, 338 and a control signal input unit 339. A reference voltage generation unit 131 is connected to the voltage holding unit 337 via the switch unit 335. The voltage holding unit 337 is connected to a connection point between a voltage-current conversion unit 113 and a voltage holding unit 112 in the signal receiving unit 110 via a switch unit 132. The reference voltage generation unit 131 is connected to the voltage holding unit 338 via the switch unit 336. The voltage holding unit 338 is connected to a connection point between a dummy voltage-current conversion unit 122 and a voltage holding unit 121 via a switch unit 133. Control terminals of the switch units 132, 133 are connected to a control signal input unit 134. Control terminals of the switch units 335, 336 are connected to the control signal input unit 339.

(Operation of Signal Receiving Device 300)

Next, an operation of the bias voltage generation unit 330 in the present embodiment will be described.

Control signals different from each other are inputted to the control signal input units 134, 339. In other words, it is controlled so that the switch units 132, 133 and the switch units 335, 336 are not in ON states simultaneously by the control signals. It is preferable in a viewpoint of stability that duty ratios of the control signals inputted to the control signal input unit 134 and the control signal input unit 339 are small to some degree.

At a timing that an ON signal is inputted to the control signal input unit 339, the switch units 335, 336 are turned ON. As a result, a reference voltage generated in the reference voltage generation unit 131 is copied and held in the voltage holding units 337, 338 respectively. On this occasion, since the signal inputted to the control signal input unit 134 is an OFF signal, the switch units 132, 133 become in OFF states. Therefore, operations of the switch units 335, 336 do not influence the signal receiving unit 110 or the leak current compensation unit 120. At a timing that an ON signal is inputted to the control signal input unit 134, the switch units 132, 133 are turned ON. As a result, the voltages having been held in the voltage holding units 337, 338 are copied and held in the voltage holding units 112, 121 respectively. On this occasion, since a signal inputted to the control signal input unit 339 is an OFF signal, the switch units 335, 336 are in OFF states and do not give influence, such as voltage escape to the reference voltage generation unit 131. As a result, the voltage generated in the reference voltage generation unit 131 can be stably given as a bias voltage to the voltage-current conversion unit 113 and the dummy voltage-current conversion unit 122.

When a voltage signal is inputted from a signal input unit 111, this voltage signal is added to the reference voltage generated in the reference voltage generation unit 131 and held in the voltage holding unit 112. If a signal inputted to the control signal input unit 134 at the above timing is an OFF signal, the voltage held in the voltage holding unit 112 does not change. On the other hand, if the signal inputted to the control signal input unit 134 is an ON signal, the switch unit 132 becomes in an ON state. Therefore, part of the voltage signal held in the voltage holding unit 112 is leaked to the voltage holding unit 337. However, it is possible to reduce a leaking voltage signal by making a retention volume (capacitance) of the voltage holding unit 337 small enough compared with a retention volume (capacitance) of the voltage holding unit 112.

In the signal receiving device 300, even if an input signal is a weak voltage signal, a leak voltage of the voltage signal to a bias voltage generation unit can be made small. Therefore, it is possible to hold an output signal effectively.

Fourth Embodiment

Figure 4:
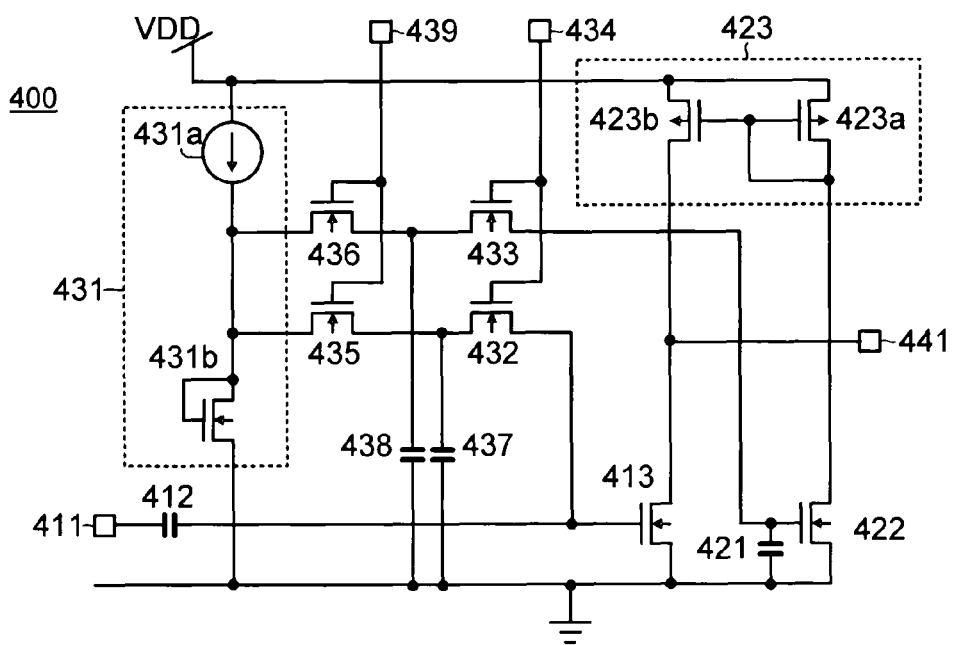
FIG. 4 is a block diagram showing a signal receiving device 400 according to a fourth embodiment.

FIG. 4 is a circuit diagram showing a signal receiving device 400 according to a concrete example of a fourth embodiment. The signal receiving device 400 has a configuration corresponding to the signal receiving device 300 according to the third embodiment. A signal input terminal 411, a capacitor 412 and a transistor 413 correspond to the signal input unit 111, the voltage holding unit 112 and the voltage-current conversion unit 113 respectively. A capacitor 421, a transistor 422 and a current mirror circuit 423 correspond to the voltage holding unit 121, the dummy voltage-current conversion unit 122 and the current mirror unit 123 respectively. A reference voltage generation unit 431, transistors 432, 433, 435, 436, capacitors 437, 438 and pulse signal input units 434, 439 correspond to the reference voltage generation unit 131, switch units 132, 133, 335, 336, the voltage holding units 337, 338 and the control signal input units 134, 339 respectively. The current mirror circuit 423 is constituted with transistors 423a, 423b. The reference voltage generation unit 431 is constituted with a constant current source 431a and a transistor 431b.

The signal input terminal 411 is connected to a gate terminal of the transistor 413 via the capacitor 412. A source terminal of the transistor 413 is grounded. A gate terminal of the transistor 422 is connected to the grounded capacitor 421. A source terminal of the transistor 422 is grounded. A drain terminal of the transistor 422 is connected to a drain terminal of the transistor 423a of an input side of the current mirror circuit 423. A gate terminal of the transistor 423a is connected to the drain terminal of the transistor 423a and a gate terminal of the transistor 423b, and a source terminal is connected to a power supply terminal VDD. A drain terminal of the transistor 423b of an output side of the current mirror circuit 423 is connected to a drain terminal of the transistor 413, a connection point thereof being a signal output terminal 441. A source terminal of the transistor 423b is connected to the power supply terminal VDD.

The constant current source 431a is connected to the power supply terminal VDD and a drain terminal of the transistor 431b. The drain terminal of the transistor 431b is connected to a gate terminal, and a source terminal is grounded. Drain terminals of the transistor 435, 436 are connected to the drain terminal of the transistor 431b. Source terminals of the transistors 435, 436 are connected to the capacitors 437, 438 respectively. The other terminals of the capacitor 437, 438 are grounded. The source terminals of the transistors 435, 436 are connected to drain terminals of the transistors 432, 433 respectively. Source terminals of the transistors 432, 433 are connected to the gate terminals of the transistors 413, 422 respectively. Gate terminals of the transistors 435, 436 are connected to the pulse signal input unit 439, while gate terminals of the transistors 432, 433 are connected to the pulse signal input unit 434.

It is preferable that elements of the same form to each other are used for the transistors 413, 422. This is for the sake that the transistors 413, 422 become uniform in terms of threshold values and leak currents. It is preferable that elements of the same form to each other are used for the transistors 423a, 423b. This is in order to make currents inputted/outputted to/from an input terminal and an output terminal of the current mirror circuit 423 uniform.

It is preferable that an element with a smaller capacity value (capacitance) compared with the capacitor 412 is used for the capacitor 437. This is in order to reduce a leak voltage from the capacitor 412 to the capacitor 437.

It is preferable that an element with a smaller gate width or gate number compared with the transistor 413 is used for the transistor 431b. This is for the sake of lower power consumption of the transistor 431b, and furthermore, of the entire signal receiving device 400.

(Operation of Signal Receiving Device 400)

Next, an operation of the signal receiving device 400 will be described.

A predetermined current flows from the constant current source 431a and supplied to the transistor 431b. The transistor 431b generates a drain voltage corresponding to a supplied current value. The transistors 435, 436, 432, 433 function as switch circuits, becoming in ON states when signals inputted to the pulse signal input units 439, 434 are ON signals, and becoming in OFF states when the signals are OFF signals.

Different control signals are inputted to the respective pulse signal input units 439, 434. The control signals are controlled so that the transistors 435, 436 and the transistors 432, 433 do not become in ON states simultaneously. It is preferable that duty ratios of the control signals inputted to the pulse signal input units 439, 434 are small.

At a timing that an ON signal is inputted to the pulse signal input unit 439, the transistors 435, 436 are turned ON. As a result, a drain voltage generated in the transistor 431b is copied and held in the respective capacitors 437, 438. On this occasion, since a signal inputted to the pulse signal input unit 434 is an OFF signal, the transistors 432, 433 are in OFF states, not influencing the gate terminals of the transistors 413, 422. At a timing that an ON signal is inputted to the pulse signal input unit 434, the transistors 432, 433 are turned ON, the voltages having been held in the capacitors 437, 438 are copied and held in the capacitors 412, 421 respectively and applied to the gate terminals of the transistors 413 and 422. On this occasion, since a signal inputted to the pulse signal input unit 439 is an OFF signal, the transistors 435, 436 become in OFF states and voltage escape and the like to the transistor 431b can be prevented. As a result, a reference voltage generated in the transistor 431b is stably applied to the gate terminals of the transistors 413 and 422 as a bias voltage.

In a no signal state, in which no signal is inputted to the signal input terminal 411, equal bias voltages are applied to the gate terminals of the transistors 413 and 422. Since the bias voltage has a value almost equal to that of threshold voltages of the transistors 413 and 422, the transistors 413 and 422 are in OFF states. On this occasion, a drain current does not flow practically, but a subtle leak current occurs.

The leak current having occurred in the transistor 422 is inputted to the input terminal of the current mirror circuit 423. A current of almost the same value is outputted from the output terminal (drain terminal of the transistor 423b) of the current mirror circuit 423 and inputted to the drain terminal of the transistor 413.

The signal output terminal 441 outputs a difference between an output current from the transistor 423b and an output current from the transistor 413. Therefore, if the leak currents of the transistors 413 and 422 are equal, a signal corresponding to the leak current is not outputted from the signal output terminal 441. In other words, at the time of no signal input, no signal is outputted from the signal output terminal 441.

When a voltage signal is inputted from the signal input terminal 411, a voltage of this voltage signal, being added to the reference voltage generated in the transistor 431b, is applied to the gate of the transistor 413. On this occasion, only a signal corresponding to the inputted voltage signal is outputted from the signal output terminal 441.

As stated above, in the signal receiving device 400, even if an input signal is a weak voltage signal, a current can be outputted effectively. Further, an error due to a leak current can be reduced.

It should be noted that bias voltage values given to the transistors 413, 422 can be freely adjusted by adjusting a current value supplied in the constant current source 413a. Thereby, input sensitivity can be adjusted accordingly.

Fifth Embodiment

Figure 5:
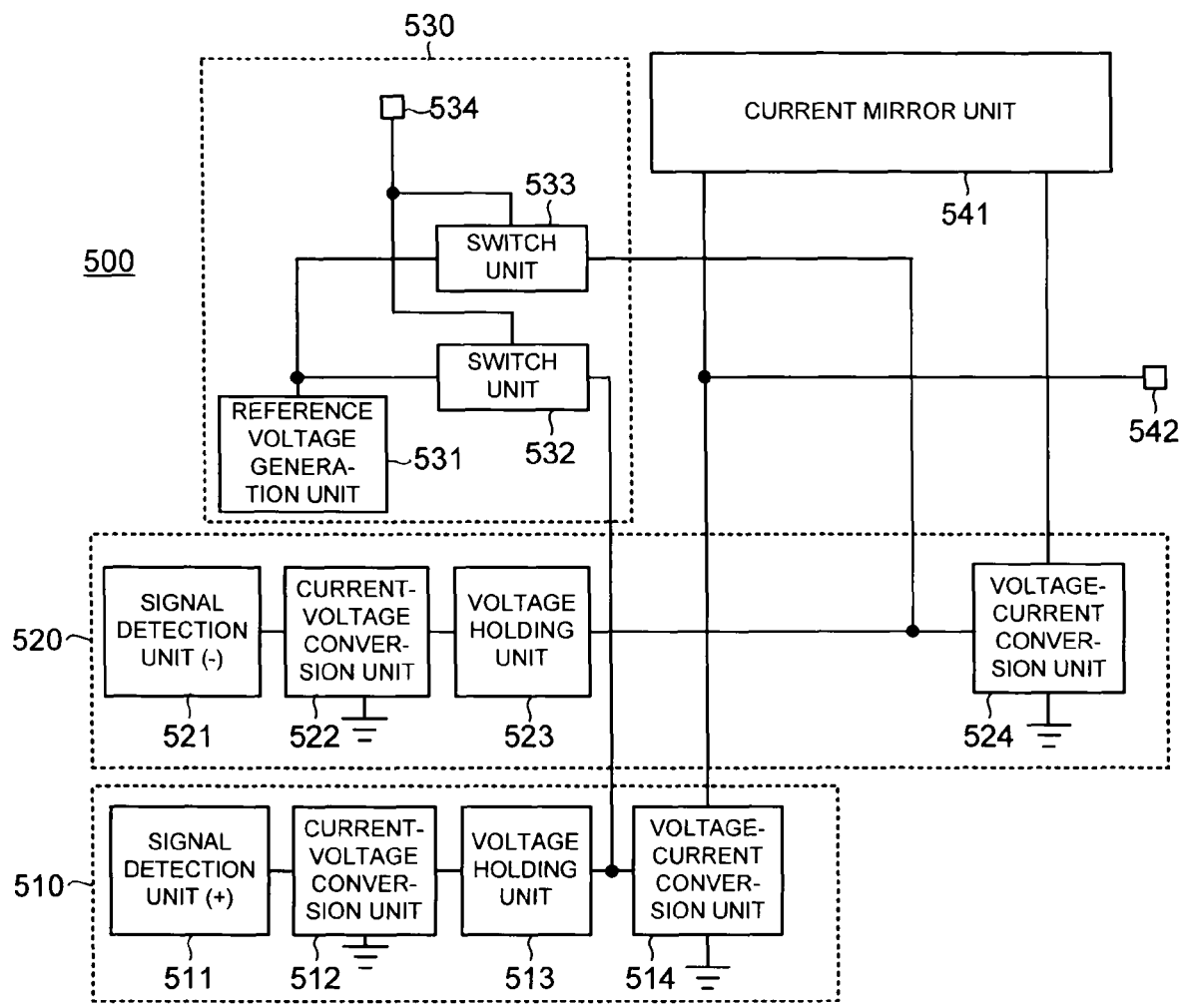
FIG. 5 is a block diagram showing a signal receiving device 500 according to a fifth embodiment.

FIG. 5 is a block diagram showing a signal receiving device 500 according to a fifth embodiment. The signal receiving device 500 includes a positive side receiving unit 510, a negative side receiving unit 520, a bias voltage generation unit 530, a current mirror unit 541 and a signal output unit 542. The positive side receiving unit 510 and the negative side receiving unit 520 are differential signal receiving units. The positive side receiving unit 510 is constituted with a signal detection unit 511, a current-voltage conversion unit 512, a voltage holding unit 513 and a voltage-current conversion unit 514. The negative side receiving unit 520 is constituted with a signal detection unit 521, a current-voltage conversion unit 522, a voltage holding unit 523 and a voltage-current conversion unit 524. The signal detection unit 511 is connected to the voltage-current conversion unit 514 via the current-voltage conversion unit 512 and the voltage holding unit 513. The current-voltage conversion unit 512 and the voltage-current conversion unit 514 are grounded. Meanwhile, the signal detection unit 521 is connected to the voltage-current conversion unit 524 via the current-voltage conversion unit 522 and the voltage holding unit 523. The current-voltage conversion unit 522 and the voltage-current conversion unit 524 are grounded.

(Operation of Signal Receiving Device 500)

An operation of the signal receiving device 500 will be described.

At a time of no signal input, in which no signal is inputted, no change occurs to output terminals of the signal detection units 511, 521. Therefore, no change occurs to the current-voltage conversion units 512, 522, either, and only bias voltages supplied from the bias voltage generation unit 530 are applied to the voltage holding units 513, 523. Therefore, the same current values are outputted from the voltage-current conversion units 514, 524, and no signal output occurs in the signal output unit 542 from which a difference between both the current values is outputted.

When a signal is inputted, the signal detection units 511, 521 output differential signals. Therefore, when the signal detection unit 511 outputs a minus signal, the signal detection unit 521 outputs a plus signal. Those signals are converted to positive and negative voltage signals in the respective current-voltage conversion units 512, 522.

Those voltage signals are added to the bias voltages held in the voltage holding units 513, 523 respectively. Therefore, a voltage made by adding a signal voltage to the bias voltage is applied to the voltage-current conversion unit 514, so that an output current is increased. Meanwhile, a voltage made by subtracting a signal voltage from the bias voltage is applied to the voltage-current conversion unit 524, so that an output current is decreased. A signal with twice a strength is outputted from the signal output unit 542 from which the difference between both the voltages is outputted.

Noises overlapping reception signals are outputted from the signal detection units 511, 521 respectively as in-phase signals, and inputted to the current-voltage conversion units 512, 522. Since a difference between the in-phase signals is outputted from the signal output unit 542, a signal outputted therefrom does not include the noise.

In the signal receiving device 500, even if an input signal is a weak signal, the signal can be detected as a differential signal, so that a difference can be detected and outputted. Further, a noise is not detected as a difference, so that the signal receiving device 500 is resistant to noises.

Sixth Embodiment

Figure 6:
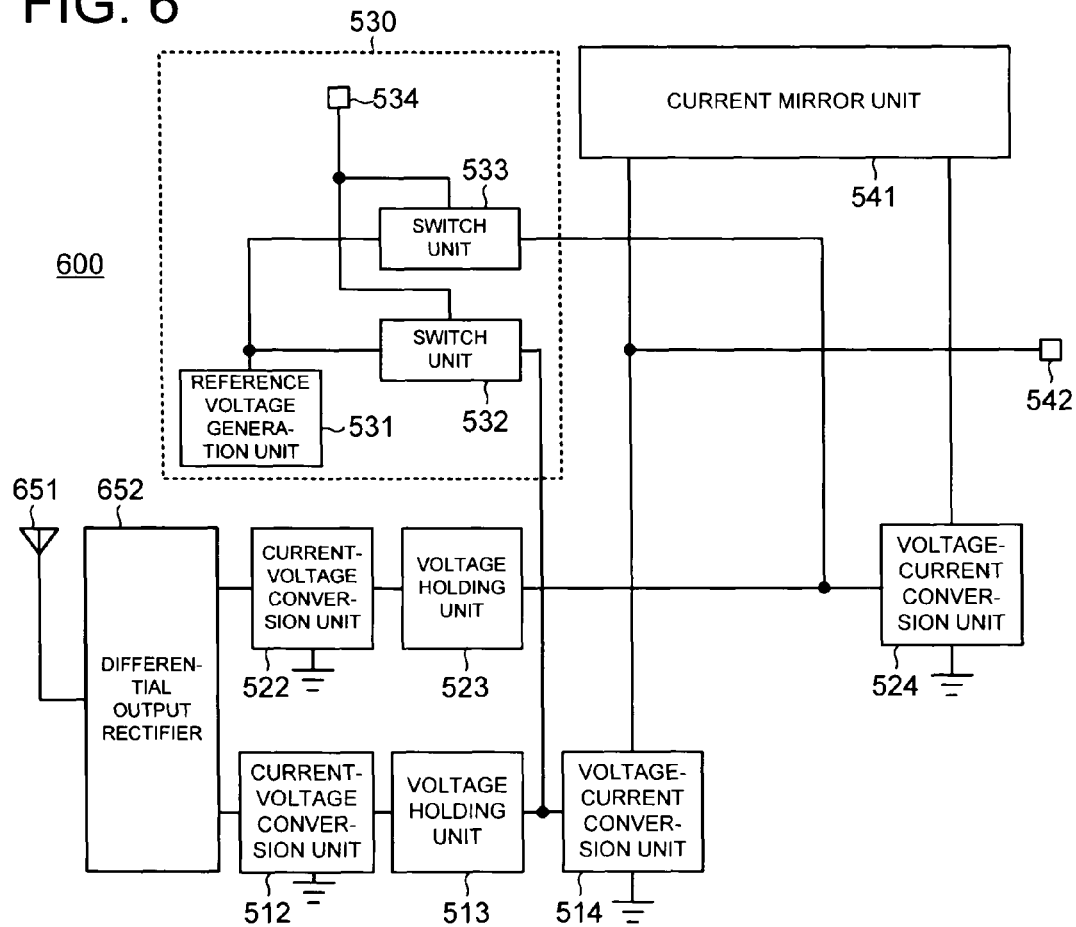
FIG. 6 is a block diagram showing a signal receiving device 600 according to a sixth embodiment.

FIG. 6 is a block diagram showing a signal receiving device 600 according to a sixth embodiment. There is shown an example in which an antenna 651 and a differential output rectifier 642 are used as concrete embodiments of the signal detection units 511, 522 in FIG. 5. When a radio signal is inputted to the antenna 651, a current signal of a differential is outputted by the differential output rectifier 652. When the radio signal is received and the signal is detected by the differential output rectifier 652, both efficiency and resistance to a noise are secured.

Seventh Embodiment

Figure 7:
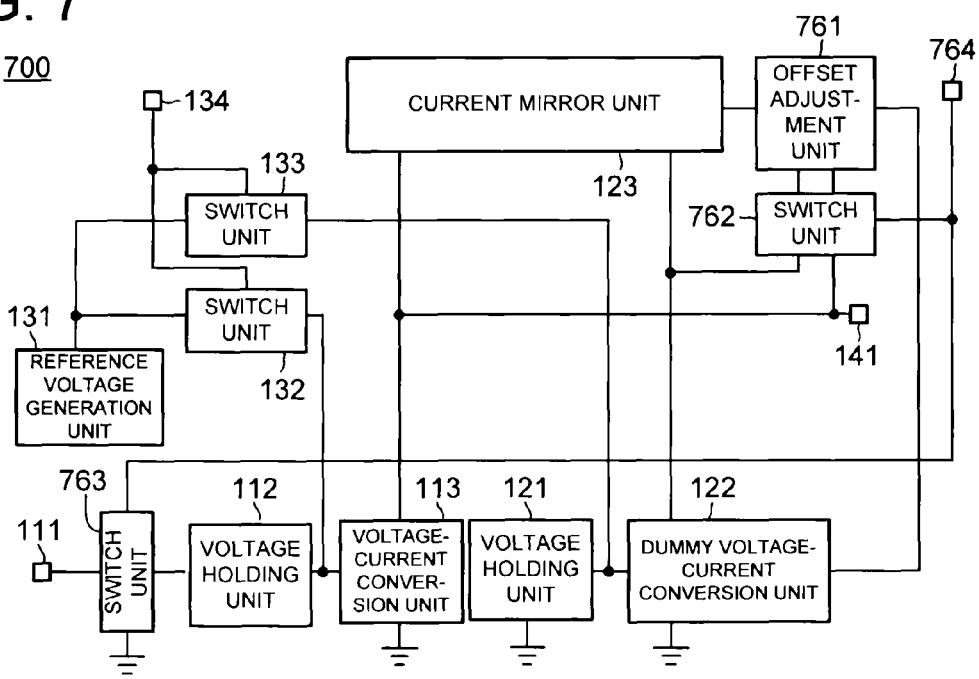
FIG. 7 is a block diagram showing a signal receiving device 700 according to a seventh embodiment.

FIG. 7 is a block diagram showing a signal receiving device 700 according to a seventh embodiment. The signal receiving device 700 includes an offset correction unit which performs correction when an offset is generated in an output current of a voltage-current conversion unit 113, an output current of a dummy voltage-current conversion unit 122, or the like. The offset correction unit is constituted with an offset adjustment unit 761, switch units 762, 763 and an adjustment mode switching signal input unit 764.

Output terminals of a signal output unit 141 and the dummy voltage-current conversion unit 122 are each connected to the offset adjustment unit 761 via the switch unit 762. The offset adjustment unit 761 is also connected to a current mirror unit 123 and the dummy voltage-current conversion unit 122.

The offset adjustment unit 761 functions as follows.
Detection unit detecting an occurrence of an offset voltage in the signal output unit 141
Adjustment unit adjusting an offset voltage by controlling the current mirror unit 123 or the dummy voltage-current conversion unit 122

The switch unit 763 is connected between a signal input unit 111 and a voltage holding unit 112, and further, is grounded. An input of a voltage signal to an input terminal of the current-voltage conversion unit 113 can be continued or stopped by the switch 763. The adjustment mode switching signal input unit 764 is connected to the switches 762, 763.

(Operation of Signal Receiving Device 700)

Next, an operation of the offset compensation unit of the present embodiment will be described. In a present configuration, as an operation mode of the receiving device, a normal reception mode and an adjustment mode can be switched.

In the reception mode, a similar operation to that in the signal receiving device 100 is performed. On this occasion, an OFF signal is inputted to the adjustment mode switching signal input unit 764, and the switch unit 762 is in an OFF state while, as for the switch unit 763, the signal input unit 111 and the voltage holding unit 112 are in a connected state.

In the adjustment mode, an ON signal is inputted to the adjustment mode switching signal input unit 764. As a result, the switch unit 762 becomes in an ON state and the output terminals of the signal output unit 141 and the dummy voltage-current conversion unit 122 are each connected to the offset adjustment unit 761. Meanwhile, the switch unit 763 separates the signal input unit 111 and the voltage holding unit 112 and grounds the voltage holding unit 112. In the above state, the offset adjustment unit 761 compares voltages generated in the signal output unit 141 and the output terminal of the dummy voltage-current conversion unit 122 in a no signal input state. When both the generated voltages are different from each other (occurrence of an offset), the offset adjustment unit 761 adjusts a current mirror unit 123 or a bias voltage of the dummy voltage-current conversion unit 122, or the like so that the offset is compensated. On this occasion, it is possible to set an offset in the current mirror unit 123 or the bias voltage of the dummy voltage-current conversion unit 122, or the like, in advance. Malfunction by a certain degree of error can be prevented.

In the signal receiving device 700, an offset generated in the signal output unit 141 can be adjusted. For example, an offset is generated when characteristics of elements constituting the voltage-current conversion unit 113, the dummy voltage-current conversion unit 122 and the current mirror unit 123 are different due to manufacturing variance, temperature change or the like.

As stated above, in the signal receiving device 700, it is possible to detect a weak input signal effectively and at low power consumption and perform a signal output, and to reduce an error due to a leak current. As a result, it is possible to make a receiving device such as a radio be of lower power consumption and of lower cost.

(Application 1)

Figure 8:
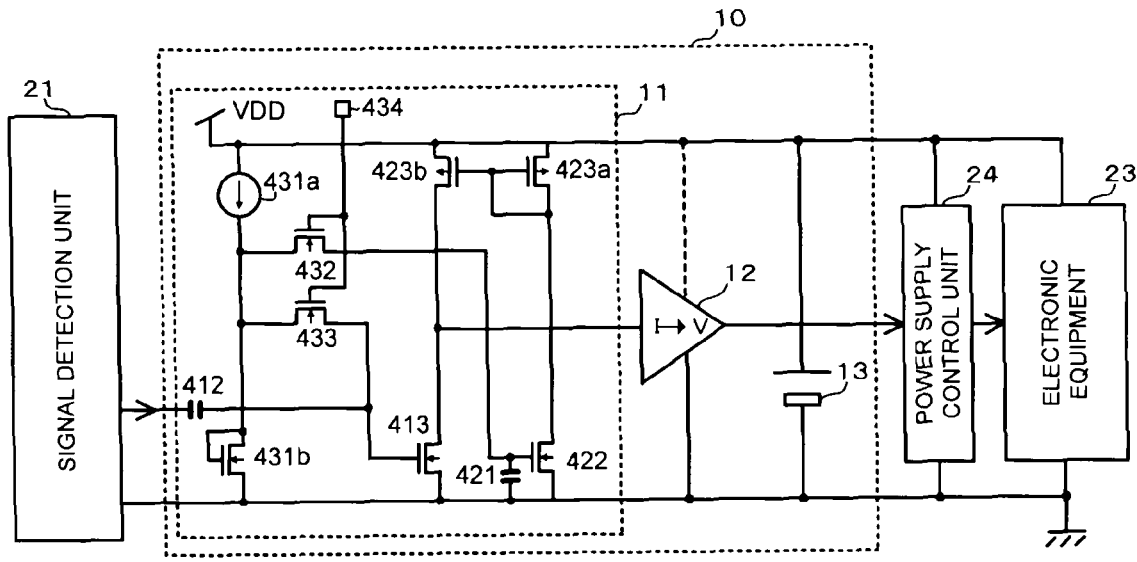
FIG. 8 is a block diagram showing an application 1 of a signal receiving apparatus.

Hereinafter, an application of a signal receiving device will be described. FIG. 8 is a block diagram showing a system using a trigger signal generator 10 including a signal receiving device 11. A signal detection unit 21, the trigger signal generator 10, a power supply control unit 24 and electronic equipment 23 are disposed. The trigger signal generator 10 has the signal receiving device 11, a current-voltage converter 12 and a battery 13.

The signal detection unit 21 is a voltage generation unit receiving outside energy and generating electricity. The signal detection unit 21 is a rectifying circuit using a diode element or a MOS transistor, or a photoelectric conversion element using a PN semiconductor element for photovoltaic generation or the like. In other words, the signal detection unit 21 includes at least an element capable of generating a direct current voltage in correspondence with an input signal (for example, an optical signal) from not-shown operating equipment.

When a photoelectric conversion element of a PN junction element of a Si semiconductor is used as the signal detection unit 21, a P-type semiconductor side is connected to a ground potential. An N-type semiconductor side jointed to a P-type semiconductor is connected to the trigger signal generator 10 as an output. When an optical signal is inputted to the photoelectric conversion element, an electric potential moves from a P-type semiconductor to an N-type semiconductor, so that an electric potential of an output is made higher. In accordance with this principle, an optical input signal is detected and a voltage in correspondence with signal strength is generated as an output. When no optical signal is inputted, a photoelectric effect does not occur and movement of the electric charge is not generated. Since the electric charge does not move and both the P-type and N-type semiconductors have ground potentials, power consumption in the signal detection unit 21 is not generated. Therefore, it is possible to wait for reception of an optical signal without consuming electricity.

The signal receiving device 11 is a signal receiving device constituted by eliminating the transistors 435, 436, capacitors 437, 438 and the pulse signal input unit 539 from the signal receiving device 400, and corresponds to the signal receiving device 100 in terms of a function. In other words, the signal receiving device 11 can also be considered to be a concrete example of the signal receiving device 100. It should be noted that the signal receiving devices 100 to 700 may be also applied accordingly instead of the signal receiving device 11.

The trigger signal generator 10 acts by voltage generation of the signal detection unit 21 in accordance with an input signal from the not-shown operation equipment, and a trigger signal is outputted. As a result, the power control unit 24 is controlled and the electronic equipment 23 is activated. It should be noted that signal data can be outputted from the signal detection unit 21 by using a signal column by light emission/extinction of an optical signal.

(Application 2)

Figure 9:
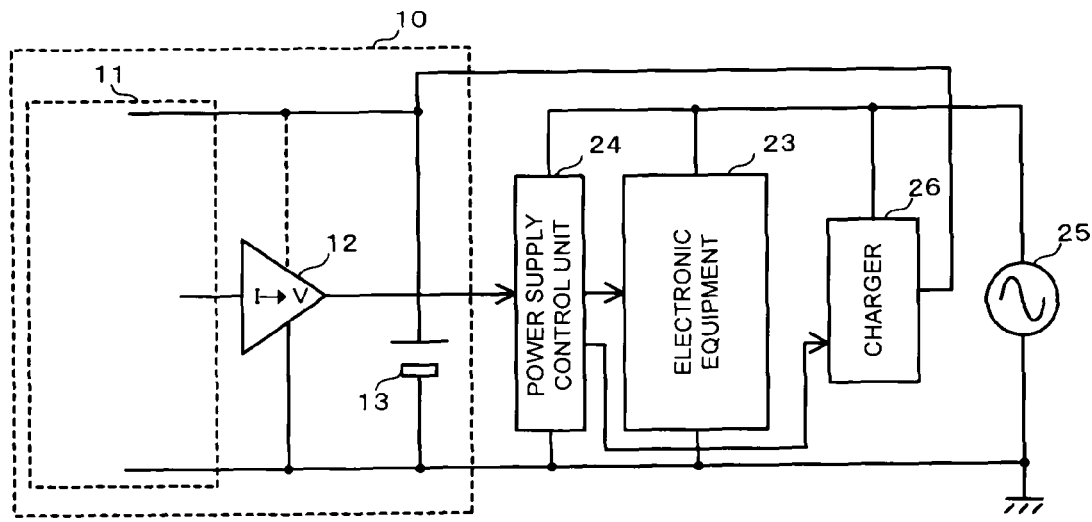
FIG. 9 is a block diagram showing an application 2 of a signal receiving apparatus.

Next, another system using a trigger signal generator including a signal receiving device will be described with reference to FIG. 9. In FIG. 9, the same numerals and symbols are given to the same components as the components in the drawings already described and description thereof will be omitted. An internal configuration of a signal receiving device 11 is omitted to be shown. In this application, charging of a battery power supply 13 is done by a trigger signal.

In FIG. 9, electronic equipment 23 and a power supply control unit 24 are supplied of electric power not from the battery power supply 13 but from an AC power supply 25. A charger 26 is also supplied of electric power from the AC power supply 25. When a trigger signal is inputted from an activation circuit 10 to the power supply control unit 24, a power supply of the electronic equipment 23 is ON-controlled by the power supply control unit 24. At the same time, a power supply of the charger 26 is ON-controlled by the power supply control unit 24. Thereby, charging from the charger 26 to the battery power supply 13 is started.

In other words, when a power-on trigger signal is inputted from the activation circuit 10 to the power supply control unit 24, the electronic equipment 23 is activated by an output of the power supply control unit 24. The battery 26 is also activated by the output of the power supply control unit 24, whereby an appropriate voltage is outputted from the charger 26 and applied to a positive electrode of the battery power supply 13. As a result, the battery power supply 13 is charged. The electronic equipment 23, the power supply control unit 24 and the charger 26 are supplied of power supplies from, for example, the AC power supply 25 (or external DC power supply), whose output capacitance is larger than that of the battery power supply 13.

When the output trigger signal of the activation circuit 10 is in an OFF state, the power supply control unit 24 is in an OFF state. Therefore, the electronic equipment 23 and the charger 26 are also in OFF states, so that electric power of the AC power supply is not consumed.

In this application 2, the battery power supply 13 is charged from the charger 26 when the electronic equipment 23 is in a power-on state. As a result, the battery power supply 13 is charged automatically when the electronic equipment 23 is in the power-on state, so that an exchange due to battery exhaustion of the battery power supply 13 becomes almost unnecessary.

(Other Applications)

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal receiving device, comprising:
    a first conversion unit comprising a first input terminal to which a signal including a voltage signal and a reference voltage is inputted, and a first output terminal which output a first current signal voltage-current converted from the signal;
    a second conversion unit comprising a second input terminal to which the reference voltage is inputted, and a second output terminal which output a second current signal voltage-current converted from the reference voltage;
    a current mirror circuit comprising a third input terminal to which the second current signal is inputted, and a third output terminal which output a third current signal corresponding to the second current signal; and
    an output unit connected to both the first and third output terminals.

2. The device according to claim 1, further comprising a voltage holding unit connected to the first input terminal, the voltage holding unit holding an applied voltage.

3. The device according to claim 1, further comprising a voltage holding unit connected to the second input terminal, the voltage holding unit holding an applied voltage.

4. The device according to claim 1, further comprising:
    a reference voltage generation unit generating the reference voltage;
    a first switch connecting the reference voltage generation unit and the first input terminal; and
    a second switch connecting the reference voltage generation unit and the second input terminal.

5. The device according to claim 4, further comprising:
    a third switch connected between the reference voltage generation unit and the first input terminal;
    a first voltage holding unit connected between the third switch and the first switch;
    a fourth switch connected between the reference voltage generation unit and the second switch;
    a second voltage holding unit connected between the fourth switch and the second switch.

6. The device according to claim 5,
    wherein periods when the first and third switches are ON do not overlap each other.

7. The device according to claim 5,
    wherein periods when the second and fourth switches are ON do not overlap each other.

8. The device according to claim 4,
    wherein the reference voltage generated by the reference voltage generation unit is variable.

9. The device according to claim 1,
    wherein the reference voltage is equal to or lower than threshold voltages of the first and second conversion units.

10. The device according to claim 1,
    wherein, when a voltage of the voltage signal is larger than a predetermined voltage, a current outputted from the output unit changes in correspondence with a change of the voltage of the voltage signal.

11. The device according to claim 10,
    wherein the predetermined voltage corresponds to a difference between threshold voltages of the first and second conversion units.

12. The device according to claim 1,
wherein the voltage signal is one of a pair of differential signals, and
the other of the pair of differential signals and the reference voltage are inputted to the second input terminal.

13. The device according to claim 1, further comprising:
a switch making an input of the voltage signal to the first input terminal continued or stopped;
a detection unit detecting generation of an offset voltage in the output unit, when the switch is making the input of the voltage signal to the first input terminal stopped; and
an adjustment unit adjusting the offset voltage by controlling the current mirror circuit or the second conversion unit, when the detection unit detects generation of the offset voltage.

* * * * *